(12) United States Patent
Schroen

(10) Patent No.: US 6,998,297 B2
(45) Date of Patent: Feb. 14, 2006

(54) WAFER LEVEL PACKAGING

(75) Inventor: Walter H. Schroen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 86 days.

(21) Appl. No.: 10/866,448

(22) Filed: Jun. 11, 2004

(65) Prior Publication Data

US 2004/0222504 A1 Nov. 11, 2004

Related U.S. Application Data

(60) Continuation of application No. 09/531,671, filed on Mar. 20, 2000, now abandoned, which is a division of application No. 08/963,769, filed on Nov. 4, 1997, now Pat. No. 6,407,333.

(60) Provisional application No. 60/031,464, filed on Nov. 21, 1996.

(51) Int. Cl.
*H01L 21/44* (2006.01)

(52) U.S. Cl. .......... 438/123; 438/124; 438/127
(58) Field of Classification Search ......... 438/438, 438/64, 68, 114, 118, 123, 124, 125, 127
See application file for complete search history.

(56) References Cited

U.S. PATENT DOCUMENTS

| | | | |
|---|---|---|---|
| 4,695,870 A | 9/1987 | Patraw | 357/74 |
| 5,148,266 A | 9/1992 | Khandros et al. | 357/80 |
| 5,166,866 A | 11/1992 | Kim et al. | 361/403 |
| 5,384,155 A | 1/1995 | Abbott et al. | 427/125 |
| 5,519,251 A | 5/1996 | Sato et al. | 257/666 |
| 5,685,885 A | 11/1997 | Khandros et al. | 29/841 |
| 5,763,829 A | 6/1998 | Tomita et al. | 174/52.2 |
| 5,798,286 A * | 8/1998 | Faraci et al. | 438/113 |
| 5,801,439 A | 9/1998 | Fujisawa et al. | 357/686 |
| 5,827,999 A | 10/1998 | McMillan et al. | 174/52.4 |
| 5,834,691 A | 11/1998 | Aoki | 174/52.4 |
| 5,907,785 A * | 5/1999 | Palagonia | 438/613 |
| 5,959,354 A * | 9/1999 | Smith et al. | 257/734 |
| 6,204,455 B1 | 3/2001 | Gilleo et al. | 174/261 |

FOREIGN PATENT DOCUMENTS

DE 4238646 A1 6/1993
JP 08045900 A * 2/1996

* cited by examiner

*Primary Examiner*—Tom Thomas
*Assistant Examiner*—N Drew Richards
(74) *Attorney, Agent, or Firm*—Yingsheng Tung; Wade James Brady, III; Frederick J. Telecky, Jr.

(57) ABSTRACT

An integrated circuit package (50) may include an integrated circuit chip (22) having an integrated circuit (14). A lead frame (28) may be opposite the integrated circuit chip (22). The lead frame (28) may include at least one lead (30) electrically coupled to the integrated circuit (14) by a connector (42). The lead (30) may be within a periphery (32) of the integrated circuit chip (22). An encapsulant (44) may cover the integrated circuit (14), the connector (42) and a portion of the lead frame (28). A remaining portion of the lead frame (28) may be exposed from the encapsulant (44).

8 Claims, 2 Drawing Sheets

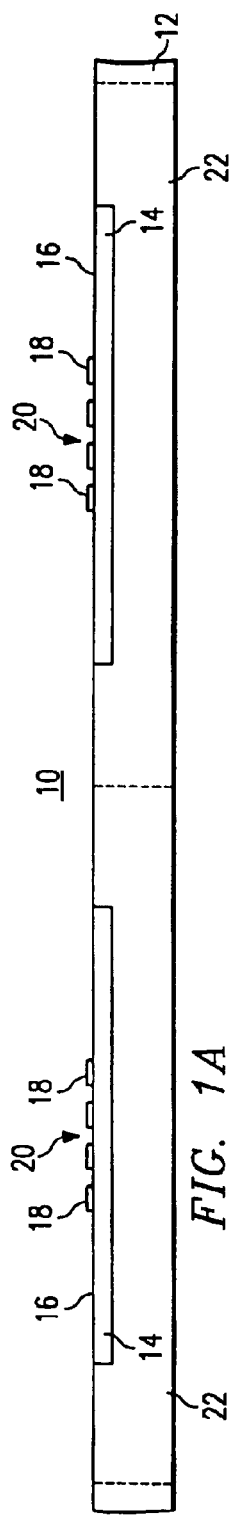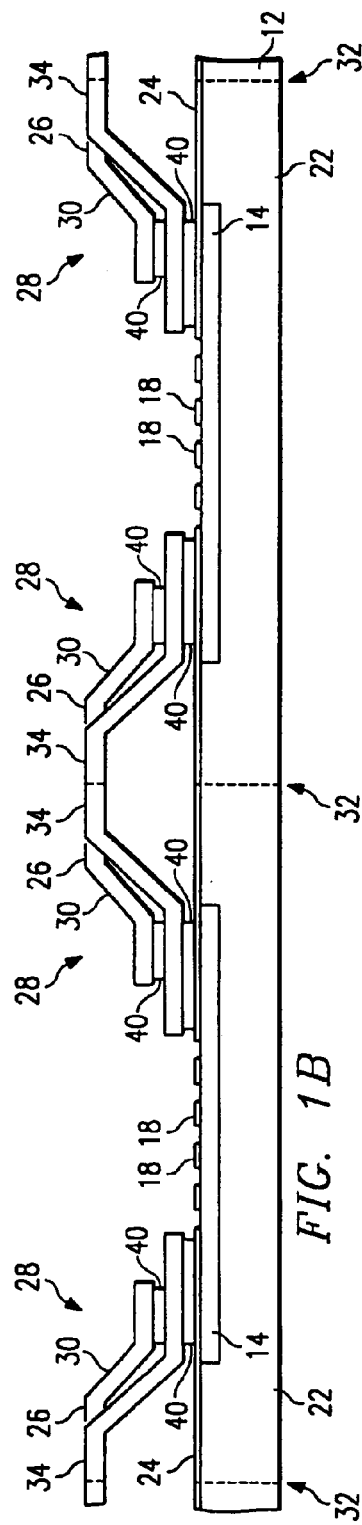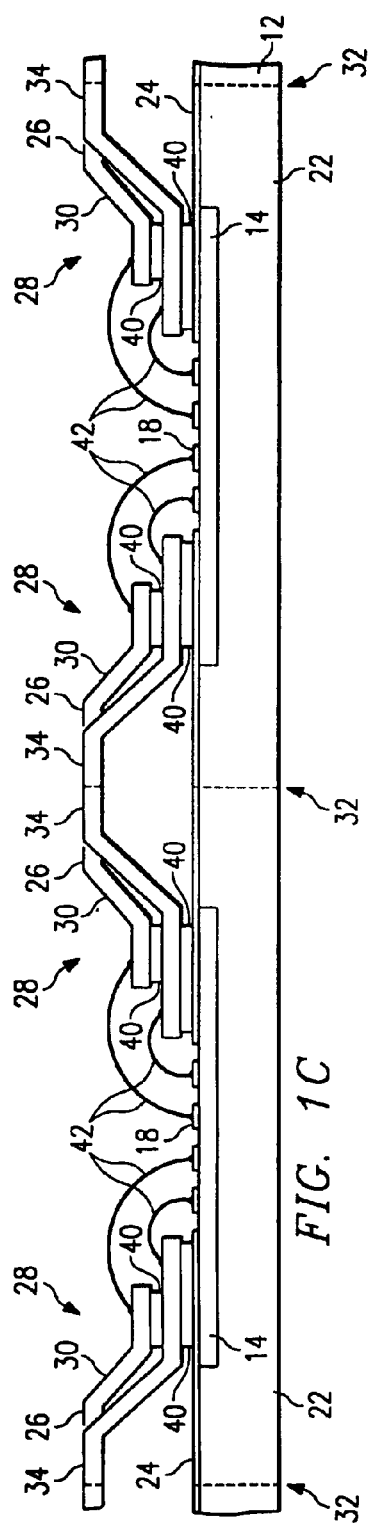

WAFER LEVEL PACKAGING

This is a continuation of application Ser. No. 09/531,671 filed Mar. 20, 2000, abandoned, which is a divisional of application Ser. No. 08/963,769 filed Nov. 04, 1997, now U.S. Pat. No. 6,407,333, which claims priority of provisional application Ser. No. 60/031,464 filed Nov. 21, 1996.

TECHNICAL FIELD OF THE INVENTION

This invention relates generally to the field of integrated circuit packaging, and more particularly to wafer level packaging of integrated circuits.

BACKGROUND OF THE INVENTION

The processes involved in the fabrication and packaging of circuit chips are well known. Typically, an array of identical circuits is patterned onto a circular semiconductor wafer using well known microlithographic techniques. The wafer is then sawed into many rectangular pieces to separate the individual circuits from one another, so that each circuit occupies its own circuit chip.

The chips are individually mounted onto lead frames, where they are held in place by means of an epoxy. A wire bonder is then used to establish electrical connections between the die pads on the chip and the respective leads of the lead frame.

With the chip physically and electrically attached to the lead frame, the chip and lead frame are placed into a mold equipment, where plastic is transfer molded to surround the assembly. This plastic packaging serves to protect the chip exposure to light, moisture and contamination, which could damage the circuit components, as well as making the entire assembly mechanically rigid and durable. The molded plastic is then cured by means of heating in an oven for several hours.

The leads of the lead frame are then trimmed and formed into the desired shape. For example, the leads may be formed into a "gull wing" shape for surface-mounted chips. At this stage, various electrical and mechanical tests are performed to determine whether the chip will function for its intended purpose.

The circuit chip industry is very cost-competitive. It is therefore desirable to shorten, streamline or eliminate packaging steps to shorten production time and reduce production costs for the chips.

SUMMARY OF THE INVENTION

Accordingly, a need has arisen in the art for an improved integrated circuit packaging. The present invention provides a method of packaging integrated circuits at the wafer level. Additionally, the present invention provides a chip size package.

In accordance with the present invention, an integrated circuit package may include an integrated circuit chip. A lead frame may be opposite the circuit side of the integrated circuit chip. The lead frame may include at least one lead electrically coupled to the integrated circuit by a connector. The lead may be within a periphery of the integrated circuit chip. An encapsulate may cover the integrated circuit, the connector and a portion of the lead frame. A remaining portion of the lead frame may be exposed from the encapsulant.

More specifically, in accordance with one embodiment of the present invention, an integrated circuit may be packaged at the wafer level. In this embodiment, a sheet of lead frames may be opposite a plurality of integrated circuit chips. The encapsulate may cover the integrated circuits and a portion of each lead frame. Each encapsulated integrated circuit and opposing lead frame may form a discrete integrated circuit package.

Important technical advantages of the present invention include providing chip size packages for integrated circuits. In particular, a lead frame, connectors and encapsulant do not extend beyond a periphery of an opposing integrated circuit chip. Accordingly, package volume is minimized and the chip may be used in devices requiring extremely small chips.

Another technical advantage of the present invention includes providing a method of packaging integrated circuit chips at the wafer level. In particular, integrated circuit chips may be packaged concurrently while still part of a wafer. Accordingly, the packaging process may be carried out as a continuation of the wafer fabrication process. This serves to streamline and shorten the assembly and packaging process.

Other technical advantages will be readily apparent to one skilled in the art from the following figures, descriptions, and claims.

BRIEF DESCRIPTION OF THE DRAWINGS

For a more complete understanding of the present invention and its advantages thereof, references now made to the following description taken in conjunction with the accompanying drawings, wherein like reference numerals represent like parts, in which:

FIGS. 1A–E are a series of schematic cross-sectional diagrams illustrating wafer level packaging of an integrated circuit in accordance with one embodiment of the present invention.

DETAILED DESCRIPTION OF THE INVENTION

Figure 1D:
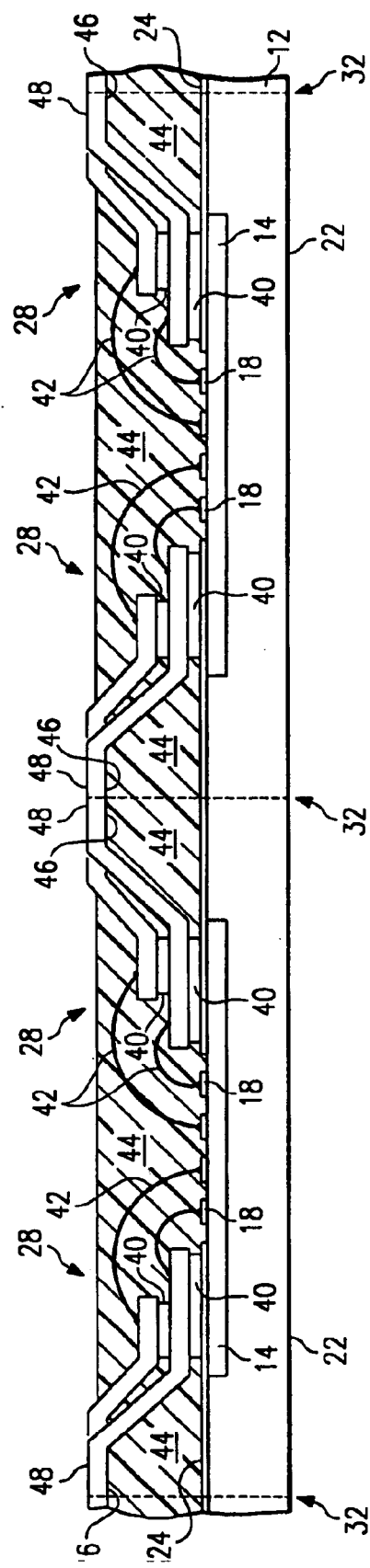

The preferred embodiments of the present invention and its advantages are best understood by referring now in more detail to FIGS. 1A–E of the drawings, in which like numerals refer to like parts throughout the several views. FIGS. 1A–E illustrate a method of packaging integrated circuits at the wafer level. Wafer level packaging may be carried out as a continuation of the wafer fabrication process to streamline and shorten the packaging process.

FIG. 1A shows a patterned wafer 10. The patterned wafer 10 may comprise a substrate 12 and a plurality of integrated circuits 14 formed in a surface 16 of the substrate 12. The substrate 12 may include one or more layers of semiconductor material. For example, the substrate 12 may include an epitaxial layer grown on a wafer.

The integrated circuits 14 may each include a plurality of bond pads 18 electrically coupled to the integrated circuit 14. As described in more detail below, the bond pads 18 provide electrical contacts through which the integrated circuit 14 may be connected to external components. In one embodiment, the bond pads 18 may be disposed along a center line 20 of the integrated circuit 14. In this embodiment, the number and configuration of the bond pads 18 may vary depending on the application. For example, the integrated circuit 14 may include one or more staggered or parallel rows of bond pads 18. It will be understood that the bond pads 18 may be disposed elsewhere on the integrated circuit 14 within the scope of the present invention.

Each integrated circuit 14 and surrounding section of the substrate 12 may define a discrete integrated circuit chip 22.

The integrated circuit chips 22 may each be packaged to provide connections to external components and to provide protection from environmental factors. Typically, patterned wafers are sawed into individual integrated circuit chips for packaging. The integrated circuit chips are each separately mounted and coupled to a lead frame, and then encapsulated with that lead frame. A problem with this method is that the separate packaging of integrated circuit chips is both time consuming and costly. Additionally, it prevents packaging from being carried out as a continuation of the wafer fabrication process.

The present invention solves this problem by providing a method of packaging integrated circuit chips at the wafer level. As described in more detail below, the integrated circuit chips 22 are packaged concurrently while still part of the patterned wafer 10. Accordingly, the packaging process may be carried out as a continuation of the wafer fabrication process. This serves to streamline and shorten the packaging process. Moreover, as also described in more detail below, the method of the present invention produces a chip size package. As a result, the packaged integrated circuit chips 22 may be used in applications which require miniaturized devices consuming an area not larger than individual chips.

Referring to FIG. 1B, a polymide coating 24 may be applied to the surface 16 of the substrate 12. The polymide coating 24 may provide better adhesion for encapsulating material that will cover and protect the integrated circuits 14. Conventional pattern etching techniques may be used to prevent the polymide coating 24 from covering the bonding pads 18. It will be understood that other or no coatings may be used within the scope of the present invention.

A sheet of lead frames 26 may be disposed opposite the surface 16 of the substrate 12. The sheet of lead frames 26 may include a plurality of individual lead frames 28 that each provide electrical connections for one of the integrated circuit chips 22.

The sheet of lead frames 26 may be a unitary sheet of material. In one embodiment, the material of the lead frames 28 may be Alloy 42 locally plated with silver. It will be understood that a variety of other materials may be used for the lead frames 28 within the scope of the present invention.

The lead frames 28 may each include a plurality of leads 30 within a periphery 32 of an opposing integrated circuit chip 22. Accordingly, the leads 30 do not overlap other integrated circuit chips 22. As described in more detail below, the leads 30 may be electrically coupled to the bonding pads 18 and extend from the encapsulant for connection to external components.

In one embodiment, the leads 30 may be in a dual level configuration. In this configuration, as shown by FIG. 1B, an upper set of leads 30 may be disposed on a lower set of leads 30. Accordingly, the dual level configuration provides a greater number of leads 30 for the integrated circuit chips 22. The lead frames 28 may also include an elongated strip (not shown) connecting one or more leads 30. The strip may be employed as a ground or supply voltage conductor. It will be understood that other lead frame 28 configurations may be used within the scope of the present invention.

The leads 30 may each have a distal end 34 for connection to an external device. In one embodiment, as shown by FIG. 1B, the distal ends 34 are in substantially one plane and may extend the periphery 32 of the integrated circuit chip 22. In this embodiment, the lead frames 28 may be cut from the lead frame sheet 26 by the post packaging sawing process used to cut the patterned wafer 10 into individual integrated circuit chips 22.

As shown by FIG. 1B, each distal end 34 may be substantially parallel to the integrated circuit chip 22. In one embodiment, the distal end 34 may include palladium. The palladium pre-plating allows the distal end 34 to be more easily soldered to a printed circuit board and the like. It will be understood that the distal end 34 may include other or no pre-plating within the scope of the present invention. For example, the distal end 34 may be solder pre-plated.

The lead frames 28 may each be mounted to an opposing integrated circuit chip 22. In one embodiment, an adhesive tape 40 may be used to mount the lead frames 28 to the opposing integrated circuit chip 22. Preferably, the adhesive tape 40 is non-conducting to prevent electrical shorting. The adhesive tape 40 may be tacky on both sides to adhere to the polymide layer 24 and to the leads 30 of the lead frame 28. The adhesive tape 40 may be attached to the lead frame 28 in a variety of ways and a variety of thicknesses. Such methods are well known and will not be further described.

Additionally, the upper set of leads 30 may be mounted to the lower set of leads 30 by the adhesive tape 40. Although the use of adhesive tape 40 has been discussed for mounting the leads 30, it will be understood that the lead frames 28 may be otherwise mounted to the opposing integrated circuit chip 22. Similarly, the upper leads may be otherwise mounted to the lower leads. For example, the leads 30 and/or lead frame 28 may be mechanically coupled by an epoxy or the like.

Referring to FIG. 1C, a connector 42 may electrically couple the leads 30 to the bonding pads 18 of the opposing integrated circuit chip 22. In one embodiment, the connectors 42 may each comprise a wire bonded to a lead 30 and to a bonding pad 18. In this embodiment, the wire may be any thin, durable conductive metal. In a particular embodiment, the wire may be gold wire having a diameter of about 1.0 to 1.2 mils. The wire may be wedge, ball or similarly bonded to the leads 30 and the bonding pads 18. In one embodiment, the wire bonding process may use trapezoidal looping which results in a low looping profile. It will be understood that the connector 42 may be other than a wire within the scope of the present invention. For example, the connector 42 may be a solder or a gold ball, or alternately wire and ball.

Referring to FIG. 1D, the integrated circuit chips 22, connectors 42 and at least a portion of the lead frames 28 may be encapsulated. The encapsulant 44 serves to protect the integrated circuit chips 22 from exposure to environmental factors that could damage the circuit components. The encapsulant 44 also serves to make the entire assembly mechanically rigid and durable. Each encapsulated integrated circuit, connectors and opposing lead frame may form a discrete integrated circuit package 50.

In one embodiment, the encapsulant 44 may be applied to only the side of the wafer 10 including the integrated circuits 14, connectors 42 and lead frames 28. The encapsulant 44 may be applied as a liquid by a syringe. In this embodiment, the liquid may be at first low viscosity and quickly solidify. It will be understood that the encapsulant 44 may be otherwise applied within the scope of the present invention. For example, the encapsulant 44 may be applied using conventional transfer molding or 3P molding technology, a mold cavity as large as the wafer 10 or the like. It will be further understood that both sides of the wafer 10 may be encapsulated within the scope of the present invention.

As shown by FIG. 1D, a remaining portion of each lead 30 may remain exposed after encapsulation. The exposed portion of the leads 30 provide connections for the integrated circuit chip 22 to external components, such as a printed circuit board and the like. In one embodiment, the exposed portion of the leads 30 may be the distal ends 34. As previously discussed, the distal ends 34 may be pre-plating with palladium to be more easily soldered to a printed circuit board or the like.

The distal ends 34 may be left exposed by regulating the volume of encapsulant 44 applied to the wafer 10. For the embodiment of FIG. 1D, the volume of the encapsulant 44 may be the amount necessary to fill up to an underside 46 of the distal ends 34. In this embodiment, the distal ends 34 may be substantially parallel to the integrated circuit chip 22 to allow the encapsulant 44 to fill up to the underside 46 of the distal ends 34 without covering an outer side 46 of the distal ends 34. The substantially parallel distal ends 34 will also allow the packaged chip to sit flat against a printed circuit board or the like.

Figure 1E:
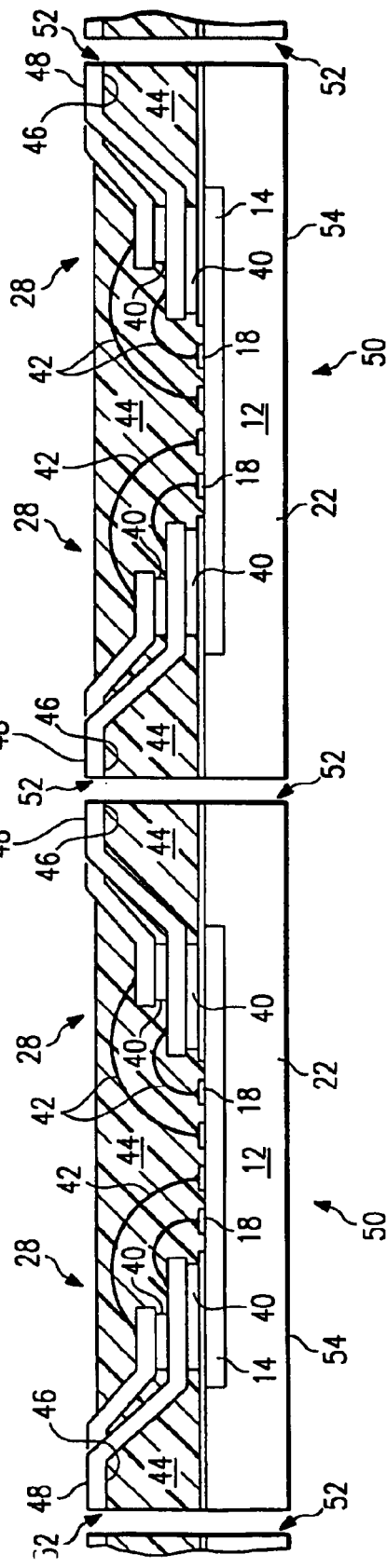

Referring to FIG. 1E, the encapsulated wafer may be sawed to detach the individual integrated circuit packages 50 from one another. In accordance with the present invention, the integrated circuit packages 50 may be complete and ready for testing, stenciling and shipment to customers. If desired, however, ends 52 of the integrated circuit packages 50 and/or the back side 54 of the substrate 12 may be first sealed. Accordingly, the present invention provides a method of packaging integrated circuits at the wafer level. The wafer level packaging may be carried out as a continuation of the wafer fabrication process to streamline and shorten the packaging process.

As shown by FIG. 1E, each integrated circuit package 50 may be a chip sized package. Accordingly, neither the lead frame 28, connectors 42 or encapsulant 44 extend beyond the periphery 32 of the integrated circuit chip 22. As a result, package volume is minimized and the chip may be used in devices requiring extremely small chips.

Although the present invention has been described with several embodiments, various changes and modifications may be suggested to one skilled in the art. It is intended that the present invention encompass such changes and modifications as fall within the scope of the appended claims.

What is claimed is:

1. A method comprising the steps of:
   a. providing a semiconductor wafer comprising a plurality of integrated circuit chips, each chip having a surface and a plurality of bonding pads associated with the integrated circuit and a periphery defined by saw lines;
   b. providing a plurality of metallic lead frames interconnected by a plurality of metallic leads having ends and a middle to form a sheet of lead frames; a first group of the leads having a lowered portion at the ends and a raised portion at the middle;
   c. applying a securing agent to the lowered portion of the leads and attaching the sheet of lead frames to the wafer; each lead frame opposing an integrated circuit chip and the raised portion of the first group of leads overhanging the saw lines;
   d. wire-bonding the bonding pads in the chips to the lowered portion of the leads;
   e. applying a encapsulating material to form a encapsulating layer and to encapsulate the plurality of chips and the plurality of lead frames, the encapsulating layer having a surface substantially parallel to the chip surface and substantially level with the raised portion of the leads; and
   f. partitioning the chips by severing the leads and wafer along the saw lines.

2. A method comprising the steps of:
   a. providing a semiconductor wafer comprising a plurality of integrated circuit chips, each chip having a surface and a plurality of bonding pads associated with the integrated circuit and a periphery;
   b. providing a plurality of metallic lead frames interconnected by a plurality of metallic leads having ends and a middle; a first group of the leads having a lowered portion at the ends and a raised portion at the middle; and
   c. applying a securing agent to the lowered portions and attaching the lead frames to the wafer; each lead frame opposing an integrated circuit chip and the first group of leads bridging adjacent chips.

3. The method of 2, further comprising a step of electrically coupling the leads to the opposing integrated circuit chip.

4. The method of claim 3, wherein the coupling step comprises of wire-bonding the leads to the bonding pads of the opposing integrated circuit chip.

5. The method of claim 2, further comprising a step of partitioning the integrated circuit chips by severing the leads and wafer along the peripheries.

6. The method of claim 2, further comprising the step of plating the leads with palladium.

7. The method of claim 2, further comprising the step of applying an encapsulating material to form a encapsulating layer and to encapsulate the plurality of chips and the plurality of lead frames, the encapsulating layer having a surface substantially parallel to the chip surface and substantially level with the raised portion of the leads.

8. The method of claim 2, wherein the securing agent is an insulator.

* * * * *